Figure 1:
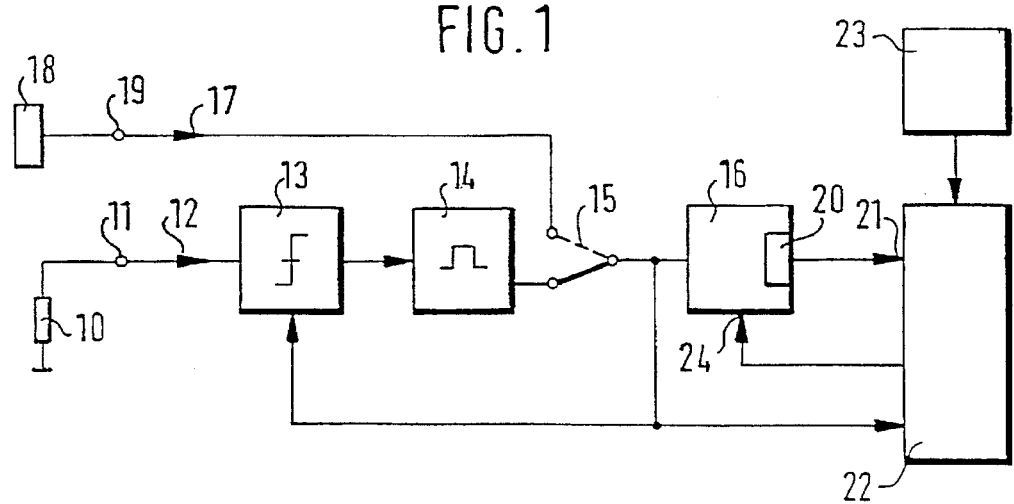

United States Patent [19]
Dittmann et al.

[11] Patent Number: 5,656,770
[45] Date of Patent: Aug. 12, 1997

[54] METHOD FOR TESTING A SPARK-IGNITED INTERNAL COMBUSTION ENGINE

[75] Inventors: Karl-Heinz Dittmann, Eislingen; Uwe Fischer, Schwaikheim, both of Germany

[73] Assignee: Robert Bosch GmbH, Stuttgart, Germany

[21] Appl. No.: 571,830

[22] PCT Filed: Jun. 18, 1994

[86] PCT No.: PCT/DE94/00675

§ 371 Date: Dec. 26, 1995

§ 102(e) Date: Dec. 26, 1995

[87] PCT Pub. No.: WO95/00755

PCT Pub. Date: Jan. 5, 1995

[30] Foreign Application Priority Data

Jun. 25, 1993 [DE] Germany .................. 43 21 170.4

[51] Int. Cl.⁶ .................................................. G01M 15/00
[52] U.S. Cl. ........................... 73/117.3; 324/379; 324/380
[58] Field of Search .................................. 73/116, 117.2, 73/117.3, 118.1; 324/378, 379, 380, 384, 392

[56] References Cited

U.S. PATENT DOCUMENTS

| | | |
|---|---|---|
| 4,661,778 | 4/1987 | Anderson ........................... 324/392 |
| 4,893,085 | 1/1990 | Taruya et al. ...................... 324/378 |
| 5,387,870 | 2/1995 | Knapp et al. ....................... 324/378 |

OTHER PUBLICATIONS

P. Paulsen: "Elektronische Motortestgeräte" [Electronic Motor Testing Devices], Franzis–Verlag, 1977, pp. 78–84.

*Primary Examiner*—George M. Dombroske
*Assistant Examiner*—Eric S. McCall
*Attorney, Agent, or Firm*—Spencer & Frank

[57] ABSTRACT

A method for testing a spark-ignited internal combustion engine is proposed, wherein a pulse-shaped signal derived from the ignition system is made available which signal allocates a pulse (34, 34a, 34b) to each switching process occurring in the ignition system. A first pulse (34) of a pulse group (32, 33) of the signal respectively starts a retriggerable timer (16) which, during its active phase ($T_A$, $T'_A$), suppresses the pulses (34a, 34b) of the pulse group (32, 33) following the first pulse (34). The time to be predetermined for the retriggerable timer (16) must be predetermined such that it is longer than the maximum interval ($T_1$, $T_2$) between the pulses (34, 34a, 34b) of a pulse group (32, 33). The method according to the invention is particularly suitable for testing a spark-ignited internal combustion engine which is provided with an ignition system comprising a spark band ignition.

6 Claims, 1 Drawing Sheet

1

METHOD FOR TESTING A SPARK-IGNITED INTERNAL COMBUSTION ENGINE

PRIOR ART

The invention starts from a method for testing a spark-ignited internal combustion engine according to the generic type of the main claim. In the technical book by P. PAULSEN, "Elektronische Motortestgeräte" [Electronic Motor Testing Devices], Franzis-Verlag, 1977, chapter 4.12 describes electronic rpm counters on pages 78–84, each having a monostable multivibrator at the input. The known rpm counters derive a pulse-shaped signal from the ignition system of the internal combustion engine, which signal is converted into a square wave signal by means of the monostable multivibrator. The use of the monostable multivibrator reduces the influence of interfering signals which are suppressed during the active phase of the multivibrator.

It is the object of the invention to propose a method for testing a spark-ignited internal combustion engine which allows the supply of a signal derived from the ignition system which signal is largely free of undesired signal portions.

This object is solved by the characteristics defined in the main claim.

ADVANTAGES OF THE INVENTION

It is provided according to the invention that a first pulse of the pulse group of the pulse-shaped signal derived from the ignition system, which signal allocates a pulse to each switching operation occurring in the ignition system, starts a retriggerable timer whose active phase is longer than the maximum interval between the pulses of a potentially occurring pulse group. With this measure it is possible to suppress the pulses of the group which follow the first pulse. The method according to the invention suppresses particularly those pulses corresponding to every switching operation in the ignition system which occur after the first pulse of a spark band ignition.

The spark band ignition provides that, at least in certain operating conditions of an internal combustion engine, for example, at low rpm's or during cold starting, a pulse spark group instead of a single ignition spark is generated in a fast time sequence. The pulse spark group is set to a predetermined range of the crankshaft angle. Therefore, it can be assumed that the-interval between the pulses of a pulse group to which the time to be predetermined for the timer must be matched is known.

An essential advantage of the method according to the invention is that devices for the testing of a spark-ignited internal combustion engine, particularly the trigger segment, can continue to employ the known circuitry. The method according to the invention supplies the device with the information regarding which pulses are to be suppressed. The method according to the invention allows, for example, a detection of the rpm of the internal combustion engine from pulses which occur in the ignition system without resulting in disturbances or measuring errors during a spark band ignition due to the further pulses of the pulse group.

Advantageous modifications and improvements of the method according to the invention ensue from the dependent claims.

An advantageous embodiment provides that the time to be predetermined for the timer is longer than the maximum expected ignition spark duration. The maximum ignition spark duration may be longer than the maximum interval between the pulses of a pulse group. This measure accomplishes a further increased resistance to interfering signals. Such a disturbance could take place, for example, when the spark breaks.

A particularly advantageous modification provides that the retriggerable timer is switched off when the rpm of the internal combustion engine exceeds a predetermined threshold value. A spark band ignition is not provided at higher rpm's. The proposed measure thus allows a processing of ignition pulses even at the highest rpm's at which the intervals between the ignition sparks enter the time range allocated to the retriggerable timer.

Another embodiment, which might be combined, if required, with the already described switching-off of the retriggerable timer provides that the time which is to be predetermined for the timer is set as a function of the rpm and thus extends over a constant angle.

Another possibility for adapting the time to be predetermined for the timer to the operating condition of the internal combustion engine provides that the time is set as a function of the occurrence of pulses which are to be suppressed.

Further possibilities for setting the time which is to be predetermined include the incorporation of both the characteristic data of the internal combustion engine and those of the ignition system that is used. Preferably, the number of cylinders is considered. Ignition systems can be divided into simple ignition systems having a rotating high-voltage distribution, ignition systems having doubly rotating high-voltage distribution, ignition systems having a static high-voltage distribution with individual spark or double spark generation and, for example, ignition systems having symmetrical or unsymmetrical firing sequence.

Further advantageous modifications and embodiments of the method according to the invention ensue from further dependent claims in connection with the description below.

DRAWING

Figure 2:
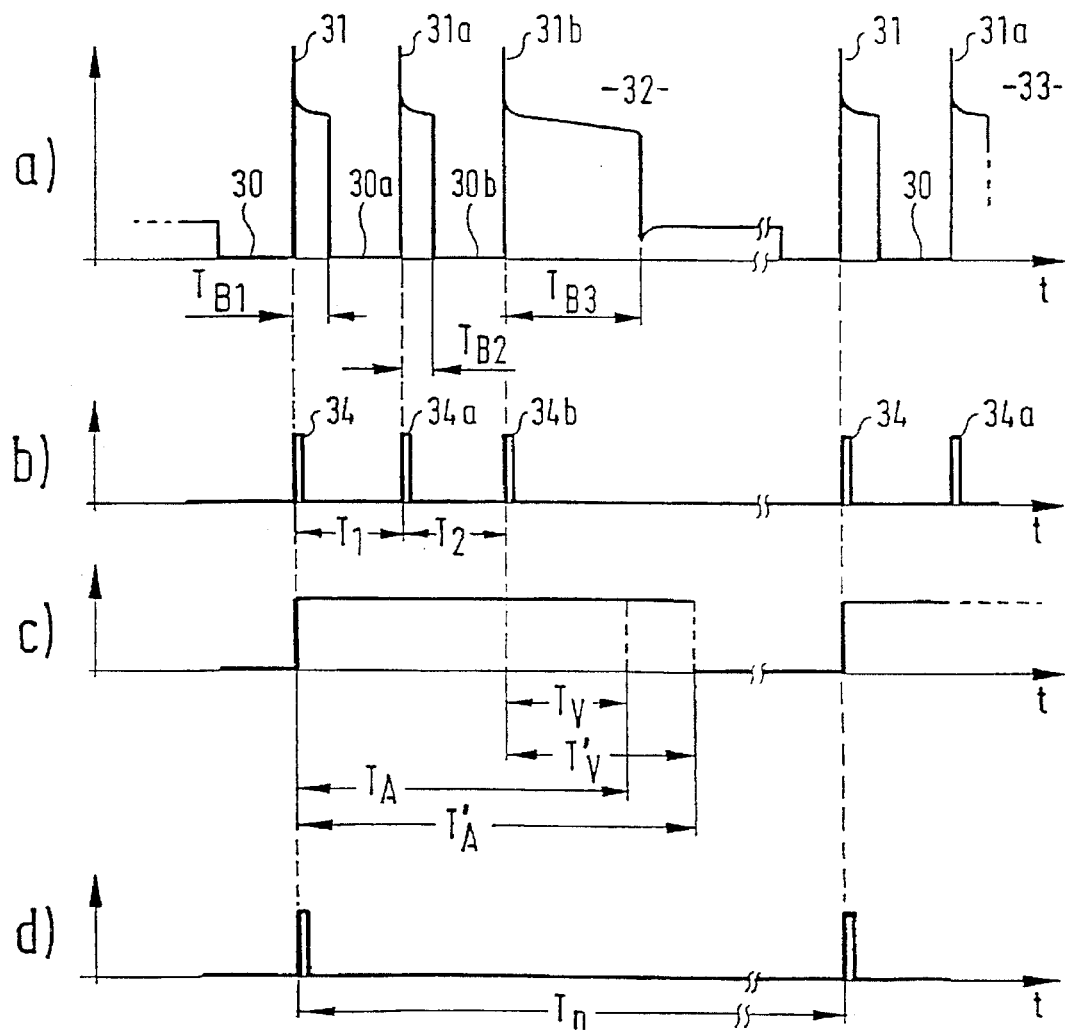

FIG. 1 shows a block circuit diagram of a device for testing a spark-ignited internal combustion engine and FIG. 2 shows signal patterns occurring within the device.

The device illustrated in FIG. 1 comprises a sensor 10 which is connected to a first input 11. A first input signal 12 is supplied to a comparator 13 which releases an output signal to a monostable multivibrator 14. The multivibrator 14 releases an output signal to a change-over switch 15 which selects an input signal of a retriggerable timer 16. The output signal of the monostable multivibrator 14 is a first possible input signal of the retriggerable timer 16. Another possible input signal is an ignition spark suppression signal 17 which is fed to the change-over switch 15 by an ignition spark suppression device 18 via a second input 19.

The retriggerable timer 16 includes a differentiating arrangement 20 which releases a trigger signal 21 to a signal processing arrangement 22. The input signal of the retriggerable timer 16 is also fed to the signal processing arrangement 22 and additionally to the comparator 13. Furthermore, the signal-processing arrangement 22 is fed an input signal 22 which is released by an input 23. The signal processing arrangement releases a control signal 24 to the retriggerable timer 16.

The method according to the invention and the functioning of the device illustrated in FIG. 1 are explained in greater detail by way of the signal patterns shown in FIG. 2 which occur at different points in the device.

The device shown in FIG. 1 is a component of an engine tester which detects, for example, the rpm of a spark-ignited internal combustion engine. In an ignition system of the internal combustion engine that is not shown in detail, the sensor 10 captures a signal which occurs during switching operations. In the embodiment, the sensor 10 is configured as an inductive sensor. Such an inductive sensor captures a current which occurs, for example, in an ignition switching device or in a primary or secondary circuit of an ignition coil. Instead of the sensor 10 being embodied as an inductive sensor, an embodiment as a capacitive sensor may also be provided. Such a capacitive sensor, for example, is a clamp-on or clip-on component which captures a voltage at a suitable location in the ignition system. The sensor 10 may also be replaced by a galvanic connection of the first input 11 with a connection point in the ignition system.

The suitable definition of the sensor 10 depends on the features of the ignition system. Conventional systems with a rotating high-voltage distribution may be provided. Systems without distributors having a single spark or double spark ignition may also be present as ignition systems. The ignition systems may have symmetrical as well as unsymmetrical ignition pulse sequences.

A possible pattern of the first input signal 12 is illustrated in detail drawing a of FIG. 2. Detail drawing a shows a voltage curve as a function of the time which curve occurs at an ignition switching device connection which is connected to a primary winding of an ignition coil. This connection is identified as terminal-1-connection. During a first closing phase 30, a magnetic field is built up in an ignition coil. The current flow is interrupted at the predetermined ignition time, A starting oscillation process having a high amplitude results in a high-voltage pulse 31 which initiates the ignition process at a spark plug. After initiating the ignition process, the ignition spark is present at the spark plug until either the energy available for maintaining the spark is no longer sufficient or until a switch-off occurs. The first spark duration is identified as $T_{B1}$. A switch-off of the ignition spark and a renewed initiation of a closing phase 30a is provided for a spark band ignition in which several ignition processes combined in a group are triggered as a function of the operating condition of the internal combustion engine. For example, in detail drawing a, three ignition pulses 31, 31a, 31b are combined in a group 32. Such a spark band ignition improves, in particular, the cold starting properties by ensuring a proper ignition process. This measure essentially allows an exhaust gas reduction or the reaching of a specific exhaust gas composition. The spark durations $T_{B1}$, $T_{B2}$ following the ignition pulses 31, 31a in detail drawing a are each reduced. Only the spark duration $T_{B3}$ following the third ignition pulse 31b has a known spark duration $T_{B3}$ whose maximum can be set. A new cycle starts with the first ignition pulse 31 of a subsequent group 33 of ignition pulses 31, 31a. In comparator 13, the first input signal 12 is compared with at least one predeterminable threshold value. The threshold value, for example, may be set such that the ignition pulses 31, 31a, 31b result in the threshold being exceeded. Each time the threshold is exceeded, the downstream monostable multivibrator 14 generates a pulse having a predetermined duration. The output signal of the monostable multivibrator 14 may have the appearance, for example, of the pulse-shaped signal that is shown in detail drawing b of FIG. 2. For this pulse-shaped signal it is essential that a pulse 34, 34a, 34b be allocated to each switching process occurring in the ignition system. Pulses 34, 34a, 34b, for example, might also respectively appear in the beginning of the closing phases 30, 30a, 30b or, for example, at the end of the spark durations $T_{B1}$, $T_{B2}$, $T_{B3}$. In detail drawing b, for example, the pulses 34, 34a, 34b start simultaneously with the occurrence of the ignition pulses 31, 31a, 31b. The intervals $T_1$, $T_2$ between the pulses 34, 34a, 34b correspond to the intervals between ignition processes which occur within a group 32, 33.

The pulse-shaped signal according to detail drawing b of FIG. 2 corresponds to a conventional signal known from prior art which can be used, for example, to evaluate an rpm. Because of the occurrence of several ignition pulses 31, 31a, 31b within a pulse group 32, 33, the pulse-shaped signal is not readily suitable for further processing. For example, an evaluation of the rpm is no longer possible if the number of the ignition pulses 31, 31a, 31b within a pulse group 32, 33 is not constant and corresponding information on the number is not made available by an ignition switching device.

The method according to the invention allows the blocking of ignition pulses 31a, 31b which follow the first pulse 31 of a pulse group 32, 33. The pulse-shaped signal according to detail drawing b, which occurs at the output of the monostable multivibrator 14, reaches the retriggerable timer 16 via the change-over switch 15. The retriggerable timer 16 is a timer that can be switched into an active phase $T_A$, $T'_A$ by the occurrence of a pulse 34, 34a, 34b of the pulse-shaped signal. The term retriggerable means that each pulse 34, 34a, 34b resets the starting value for the fixing of a predetermined time $T_\nu$, $T'_\nu$ of the timer 16 to the value 0. In detail drawing c of FIG. 2, the first pulse 34 triggers the active phase having the duration $T_A$, $T'_A$. The next pulse 34a as well as the subsequent pulse 34b each reset the retriggerable timer 16 to the value 0 as of which the predetermined time $T_\nu$, $T'_\nu$ starts running. It is essential for the proper functioning of the method according to the invention that the time $T_\nu$, $T'_\nu$ which is to be predetermined is longer than the maximum interval $T_1$, $T_2$ between the pulses 34, 34a, 34b of a pulse group 32, 33. The time $T_\nu$ to be predetermined, which is shown in detail drawing c, meets this essential minimum condition. In an advantageous modification of the invention it may be provided that the time $T_\nu$, $T'_\nu$ to be predetermined is longer than the known maximum predetermined spark duration $T_{B1}$, $T_{B2}$, $T_{B3}$. In a spark band ignition it must be assumed that the last spark duration $T_{B3}$ in a pulse Group 32, 33 has the longest duration to which the time $T_\nu$, $T'_\nu$ which is to be predetermined must be matched. In detail drawing c, the time which is to be predetermined must be set to the value $T'_\nu$. This measure accomplishes a suppression of interfering pulses to a large extent. Such interfering pulses might occur, for example, at the end of the spark durations $T_{B1}$, $T_{B2}$, $T_{B3}$. The active phase $T_A$ in detail drawing c corresponds to the time $T_\nu$ which is to be predetermined and the active phase $T'_A$ corresponds to the time $T'_\nu$ which is to be predetermined according to the modification.

From the signal shown in detail drawing c of FIG. 2, the differentiating arrangement 20 determines the trigger signal 21 shown in detail drawing d of FIG. 2 by analyzing the positive signal edges, which trigger signal is fed to the signal processing arrangement 22. Instead of evaluating the positive signal edge, it is equally possible to evaluate the negative signal edge of the signal shown in detail drawing c. The essential result is the interval $T_n$ between the first pulses 31 of successive pulse groups 32, 33. The trigger signal 21 is freed from the pulses 34a, 34b which follow the first pulse 34 within a pulse group 32, 33. Therefore, the interval $T_n$ can be converted directly into rpm.

A modification provides that, instead of the output signal of the monostable multivibrator 14, the ignition spark suppression signal 17 is supplied to the retriggerable timer 16. The change-over takes place by means of the change-over switch 15. The ignition spark suppression device 18, for example, is a controllable short-circuiting device for the primary winding of an ignition coil for the suppression of ignition processes at a precise time. The suppression of ignition processes is included, for example, in a running state analysis in which the ignition sparks of individual cylinders are suppressed. Another application is a diagnosis of a starter. This embodiment is intended to make clear that the generation of an ignition spark is not absolutely necessary for the sequence of the method according to the invention. Therefore, the pulse-shaped signal shown in detail drawing b of FIG. 2 may also be, for example, the ignition spark suppression signal 17. It is only essential that the pulse-shaped signal shown in detail drawing b of FIG. 2 allocate a pulse 34, 34a, 34b to each switching process in the ignition system.

According to FIG. 1, the input signal of the retriggerable timer 16 is fed back to the comparator 13. This measure makes it possible to change over the threshold value while the output signal of the monostable multivibrator 14 is present. This measure may be employed to further increase the resistance to interfering signals.

The input signal of the retriggerable timer 16 is also supplied directly to the signal processing arrangement 22. With the information supplied by the pulse-shaped signal according to detail drawing b of FIG. 2, the signal processing arrangement 22 can determine, for example, if the spark band ignition occurs and it is possible, for example, to count the pulses 34, 34a, 34b which occur within one pulse group 32, 33. By way of the known rpm information it can be determined if the number of pulses which occurred is in agreement with the predetermined input.

A particularly advantageous modification includes that the time $T_v$, $T'_v$ to be predetermined for the retriggerable timer 16 is influenced via the control signal 24. A simple embodiment may provide that the retriggerable timer 16 is completely switched off once a predetermined rpm threshold value is exceeded. In another embodiment it may be provided that the time $T_v$, $T'_v$ to be predetermined varies as a function of the rpm. The time $T_v$, $T'_v$ to be predetermined is reduced as the rpm increases. This embodiment may be combined with the complete switch-off of the retriggerable timer 16 once the rpm threshold value has been exceeded.

In another embodiment, the time $T_v$, $T'_v$ to be predetermined can be set as a function of the number of pulses 34, 34a, 34b which occurred within a pulse group 32, 33. Advantageously, the retriggerable timer 16 is switched off if, apart from the first pulse 34, no further pulse occurs in the pulse group 32, 33.

A further embodiment may provide that the retriggerable timer 16 is switched off once an edge change no longer occurs after the expiration of a predetermined time. This operating condition occurs if new triggering takes place constantly and the active phase $T_A$, $T'_A$ thus trends toward long time durations. In further embodiments it may be provided that the time $T_v$, $T'_v$ to be predetermined is set as a function of values which are supplied to the signal processing arrangement 22 via input 23. Such values may include, for example, information on the internal combustion engine, for instance, the number of cylinders. Further information may relate to the ignition system. Different designs of the ignition system were already listed at the outset.

A switch-off of the retriggerable timer 16 is to be understood in the sense that the pulse-shaped signal according to detail drawing b of FIG. 2, which then merely comprises the first pulse 34, can pass the retriggerable timer 16 without being influenced.

The method according to the invention may be realized both by way of circuit engineering measures and preferably within the framework of a program contained in a microprocessor system. Digital signal processing is readily possible after the occurrence of the pulse-shaped signal according to detail drawing b of FIG. 2 if the pulses 34, 34a, 34b have corresponding levels. A complete digital signal processing becomes possible if, instead of the comparator 13 which is used by way of example, an analog/digital converter is already provided for the processing of the first input signal 12.

We claim:

1. Method for testing a spark-ignited internal combustion engine, wherein a pulse-shaped signal derived from the ignition system is made available which signal allocates a pulse (34, 34a, 34b) to each switching process occurring during ignition, wherein a pulse processing takes place by means of a retriggerable timer (16) to which the pulses (34, 34a, 34b) are supplied and which releases a trigger signal (21) from which at least the rpm of the internal combustion engine can be determined, and wherein a monostable multivibrator (14) is provided to which the signal derived from the ignition system is supplied and which makes available the pulses (34, 34a, 34b) having a predetermined duration, wherein the pulses (34, 34a, 34b) are obtained from an ignition system which, at least at low rpm's of the internal combustion engine, generates several ignition pulses (31, 31a, 31b) combined in a group (32, 33) for the triggering of an ignition process, wherein the time ($T_v$, $T'_v$) to be predetermined for the retriggerable timer (16) is longer than the maximum interval (T1, T2) between the pulses (34, 34a, 34b) of a pulse group (32, 33) such that, during the active phase ($T_A$, $T'_A$) of the retriggerable timer (16), the pulses (34a, 34b) of the pulse group (32, 33) which follow the first pulse (34) are suppressed, and wherein a signal processing arrangement (22) is present which determines the rpm of the internal combustion engine from the trigger signal (21), compares it to a predetermined threshold value and releases a control signal if the threshold is exceeded, which control signal switches off the retriggerable timer (16) so that the pulses (34) having a predetermined duration, which are made available by the monostable multivibrator (14), are forwarded directly as a trigger signal (21).

2. Method according to claim 1, characterized in that the time ($T_v$, $T'_v$) to be predetermined for the retriggerable timer (16) is set as a function of the rpm of the internal combustion engine.

3. Method according to claim 1, characterized in that the time ($T_v$, $T'_v$) to be predetermined for the retriggerable timer (16) is set as a function of the number of pulses (34a, 34b) which are to be suppressed.

4. Method according to claim 1, characterized in that the time ($T_v$, $T'_v$) to be predetermined for the retriggerable timer (16) is set as a function of the number of cylinders of the internal combustion engine.

5. Method according to claim 1, characterized in that the time ($T_v$, $T'_v$) to be predetermined for the retriggerable timer (16) is set as a function of the configuration of the ignition system.

6. Method according to claim 1, characterized in that the retriggerable timer (16) is switched off if the active phase ($T_A$, $T'_A$) exceeds a predetermined time threshold value.

* * * * *